US012684789B2

(12) United States Patent
Stoib et al.

(10) Patent No.: US 12,684,789 B2
(45) Date of Patent: Jul. 14, 2026

(54) SEMICONDUCTOR DEVICE INCLUDING ACTIVE DIODE AREA

(71) Applicant: Infineon Technologies AG, Neubiberg (DE)

(72) Inventors: Benedikt Stoib, Feldkirchen-Westerham (DE); Hans-Joachim Schulze, Taufkirchen (DE); Marten Müller, Schliersee (DE); Daniel Schlögl, Villach (AT); Moriz Jelinek, Villach (AT); Holger Schulze, Villach (AT)

(73) Assignee: Infineon Technologies AG, Neubiberg (DE)

( * ) Notice: Subject to any disclaimer, the term of this patent is extended or adjusted under 35 U.S.C. 154(b) by 440 days.

(21) Appl. No.: 18/500,635

(22) Filed: Nov. 2, 2023

(65) Prior Publication Data

US 2024/0154020 A1      May 9, 2024

(30) Foreign Application Priority Data

Nov. 9, 2022    (DE) .......................... 102022129628.8

(51) Int. Cl.
H10D 8/01        (2025.01)
H10D 8/00        (2025.01)
H10D 62/10      (2025.01)

(52) U.S. Cl.
CPC ............. H10D 8/045 (2025.01); H10D 8/411 (2025.01); H10D 62/105 (2025.01)

(58) Field of Classification Search
CPC .. H10D 62/126; H10D 62/127; H10D 62/129; H10D 62/112; H10D 62/106
See application file for complete search history.

(56) References Cited

U.S. PATENT DOCUMENTS

| | | | |
|---|---|---|---|
| 2005/0116249 A1 | 6/2005 | Mauder et al. | |
| 2013/0264607 A1* | 10/2013 | Werber | H10D 62/142 |
| | | | 257/E29.197 |
| 2014/0217465 A1* | 8/2014 | Soeno | H10D 64/117 |
| | | | 257/140 |
| 2015/0206983 A1 | 7/2015 | Felsl et al. | |
| 2019/0206860 A1 | 7/2019 | Kamimura et al. | |

FOREIGN PATENT DOCUMENTS

| | | |
|---|---|---|
| DE | 102013103219 A1 | 10/2013 |
| DE | 102020123847 A1 | 3/2022 |

* cited by examiner

*Primary Examiner* — Evren Seven
(74) *Attorney, Agent, or Firm* — Murphy, Bilak & Homiller, PLLC

(57) ABSTRACT

A semiconductor device includes a semiconductor body having first and second opposite surfaces along a vertical direction, and an active diode area. The active diode area includes: a p-doped anode region adjoining the first surface; an n-doped drift region between the anode region and the second surface; an n-doped cathode contact region adjoining the second surface; a p-doped injection region adjoining the second surface and the cathode contact region; and a p-doped auxiliary region between the drift region and the cathode contact region. The auxiliary region includes first and second sub-regions. In a top view, the first sub-region covers at least part of the injection region and the second sub-region covers at least part of the cathode contact region. In the top view, the auxiliary region includes a plurality of openings covering from 0.1% to an 20% of a surface area of the active diode area at the second surface.

33 Claims, 5 Drawing Sheets

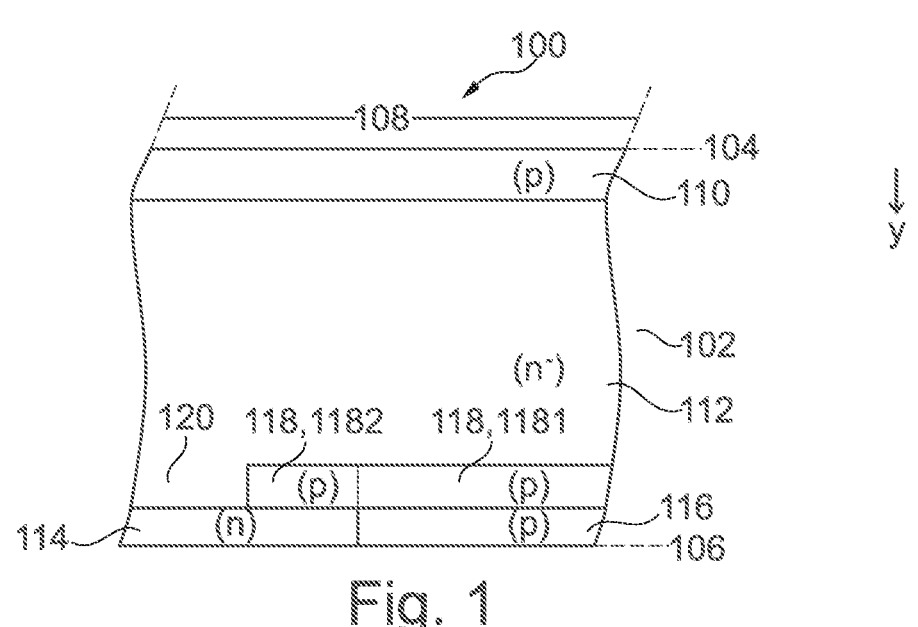
Fig. 1
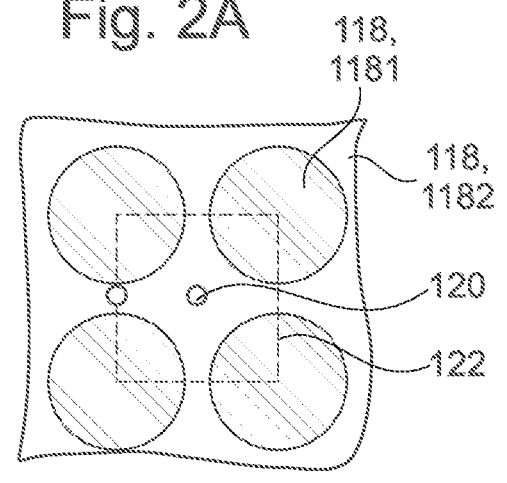
Fig. 2A
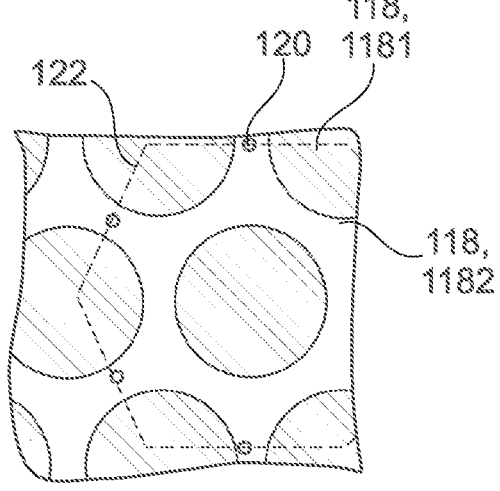
Fig. 2B
Fig. 2C
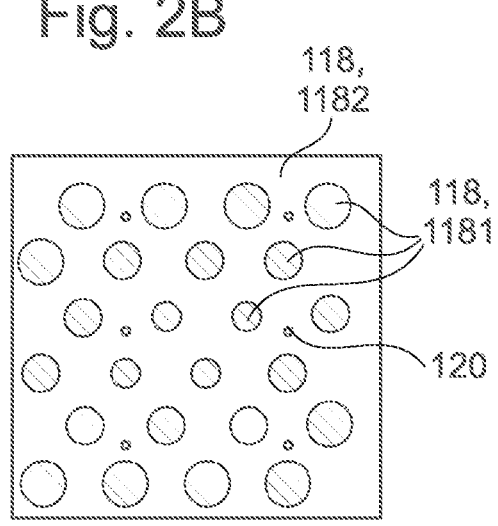
Fig. 2D

SEMICONDUCTOR DEVICE INCLUDING ACTIVE DIODE AREA

TECHNICAL FIELD

The present disclosure is related to semiconductor devices, in particular to semiconductor diodes including an active diode area.

BACKGROUND

In semiconductor diodes mobile charge carriers may flood a semiconductor region and may form a dense charge carrier plasma that yields a low forward resistance of the semiconductor diode. The charge carrier plasma is removed in a turn-off period when the device turns into blocking mode. The turn-off process contributes to the dynamic switching losses of the semiconductor diode. Typically, a desaturation mechanism may attenuate the charge carrier plasma before switching the diode in order to reduce the dynamic switching losses. When turning-off the diode, inhomogeneous carrier injection may lead to current filaments that may locally heat up and damage the diode. It is desirable to provide semiconductor diodes with improved switching characteristics.

SUMMARY

An example of the present disclosure relates to a semiconductor device. The semiconductor device includes a semiconductor body having a first surface and a second surface opposite to each other along a vertical direction. The semiconductor device further includes an active diode area. The active diode area includes a p-doped anode region adjoining the first surface of the semiconductor body. The active diode area further includes an n-doped drift region arranged between the anode region and the second surface. The active diode area further includes an n-doped cathode contact region adjoining the second surface. The active diode area further includes a p-doped injection region adjoining the second surface and the cathode contact region. The active diode area further includes a p-doped auxiliary region arranged between the drift region and the cathode contact region. The auxiliary region includes a first sub-region and a second sub-region. In a top view, the first sub-region covers at least part of the injection region, and the second sub-region covers at least part of the cathode contact region. In the top view, the auxiliary region includes a plurality of openings. The plurality of openings cover from 0.1% to 20% of a surface area of the active diode area at the second surface.

Another example of the present disclosure relates to a further semiconductor device. The semiconductor device includes a semiconductor body having a first surface and a second surface opposite to each other along a vertical direction. The semiconductor device further includes an active diode area. The active diode area includes a p-doped anode region adjoining the first surface of the semiconductor body. The active diode area further includes an n-doped drift region arranged between the anode region and the second surface. The active diode area further includes an n-doped cathode contact region adjoining the second surface. The active diode area further includes a p-doped injection region adjoining the second surface and the cathode contact region. The active diode area further includes a p-doped auxiliary region arranged between the drift region and the cathode contact region. The auxiliary region includes a first subregion and a second sub-region. In a top view, the first sub-region covers at least part of the injection region, and the second sub-region covers at least part of the cathode contact region. In the top view, the auxiliary region includes a plurality of openings. At least two of the plurality of openings differ with respect to a minimum lateral extent.

Another example of the present disclosure relates to a method for manufacturing a semiconductor device. The method includes providing a semiconductor body having a first surface and a second surface opposite to each other along a vertical direction. The method further includes forming an active diode area. Forming the active diode area includes forming a p-doped anode region adjoining the first surface of the semiconductor body. Forming the active diode area further includes forming an n-doped drift region arranged between the anode region and the second surface. Forming the active diode area further includes forming an n-doped cathode contact region adjoining the second surface. Forming the active diode area further includes forming a p-doped injection region adjoining the second surface and the cathode contact region. Forming the active diode area further includes forming a p-doped auxiliary region arranged between the drift region and the cathode contact region. The auxiliary region includes a first sub-region and a second sub-region. In a top view, the first sub-region covers at least part of the injection region, and the second sub-region covers at least part of the cathode contact region. In the top view, the auxiliary region includes a plurality of openings. The plurality of openings cover from 0.1% to 20% of a surface area of the active diode area at the second surface.

Another example of the present disclosure relates to another method for manufacturing a semiconductor device. The method includes providing a semiconductor body having a first surface and a second surface opposite to each other along a vertical direction. The method further includes forming an active diode area. Forming the active diode area includes forming a p-doped anode region adjoining the first surface of the semiconductor body. Forming the active diode area further includes forming an n-doped drift region arranged between the anode region and the second surface. Forming the active diode area further includes forming an n-doped cathode contact region adjoining the second surface. Forming the active diode area further includes forming a p-doped injection region adjoining the second surface and the cathode contact region. Forming the active diode area further includes forming a p-doped auxiliary region arranged between the drift region and the cathode contact region. The auxiliary region includes a first sub-region and a second sub-region. In a top view, the first sub-region covers at least part of the injection region, and the second sub-region covers at least part of the cathode contact region. In the top view, the auxiliary region includes a plurality of openings. At least two of the plurality of openings differ with respect to a minimum lateral extent.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the embodiments and are incorporated in and constitute a part of this specification. The drawings illustrate examples of semiconductor devices and together with the description serve to explain principles of the examples. Further examples are described in the following detailed description and the claims.

FIG. 1 is a partial cross-sectional view for illustrating an active diode area including an n-doped cathode contact region, a p-doped injection region and a p-doped auxiliary region.

FIGS. 2A to 2J and 3A to 3C are top views for illustrating design examples for the active diode area.

FIGS. 4A to 4C, 5A and 5B are cross-sectional views for illustrating design examples for the active diode area.

DETAILED DESCRIPTION

Figures 2E, 2F, 2G, 2H, 2I, 2J:
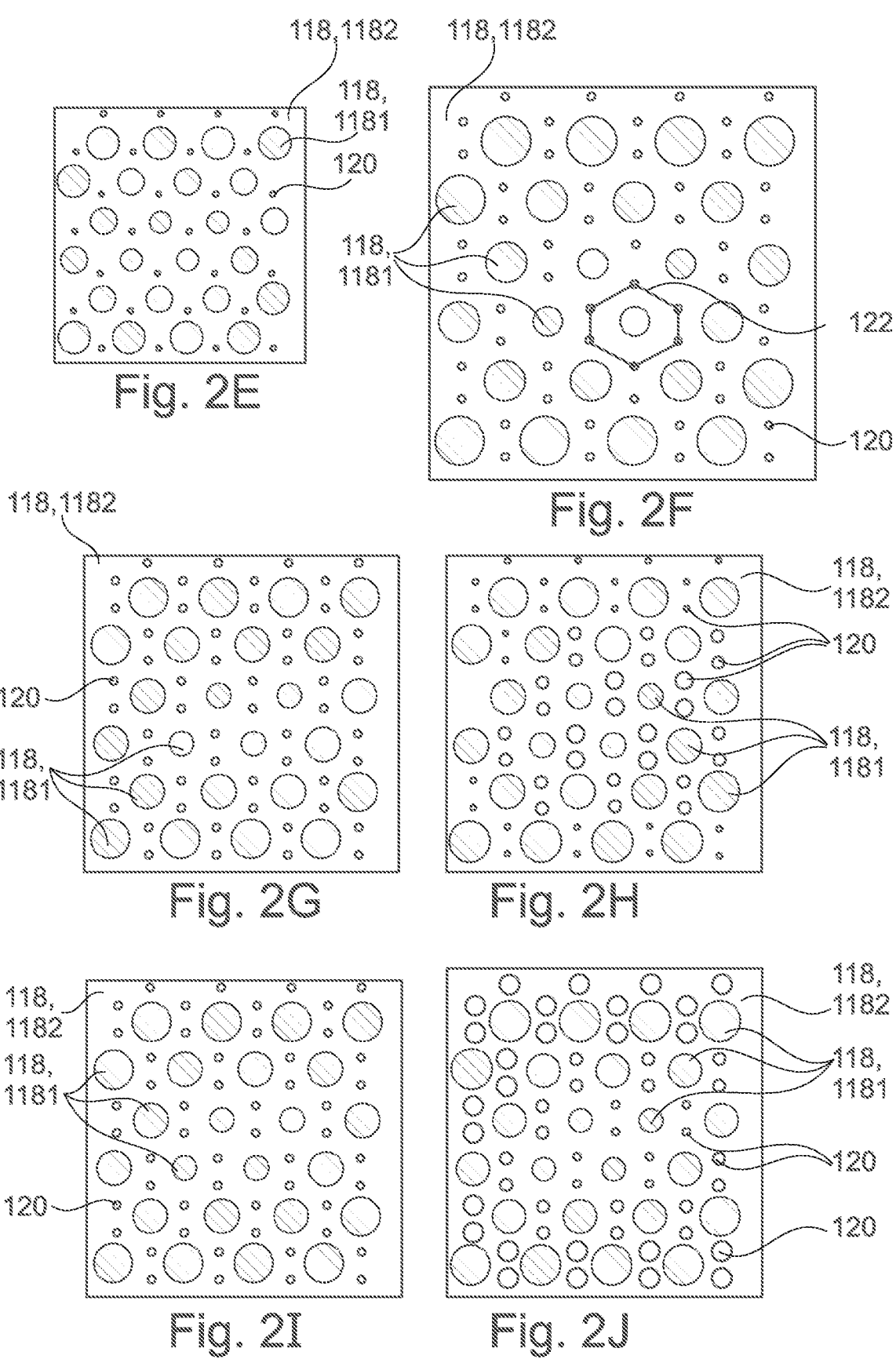

In the following detailed description, reference is made to the accompanying drawings, which form a part hereof and in which are shown by way of illustrations specific examples of semiconductor devices including an active diode area. It is to be understood that other examples may be utilized and structural or logical changes may be made without departing from the scope of the present disclosure. For example, features illustrated or described for one example can be used in conjunction with other examples to yield yet a further example. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude the presence of additional elements or features. The articles "a", "an" and "the" are intended to include the plural as well as the singular, unless the context clearly indicates otherwise.

The term "electrically connected" may describe a permanent low-resistive connection between electrically connected elements, for example a direct contact between the concerned elements or a low-resistive connection via a metal and/or heavily doped semiconductor material. The term "electrically coupled" may include that one or more intervening element(s) adapted for signal and/or power transmission may be connected between the electrically coupled elements, for example, elements that are controllable to temporarily provide a low-resistive connection in a first state and a high-resistive electric decoupling in a second state. An ohmic contact may be a non-rectifying electrical junction.

Ranges given for physical dimensions include the boundary values. For example, a range for a parameter y from a to b reads as a y b. The same holds for ranges with one boundary value like "at most" and "at least".

The terms "on" and "over" are not to be construed as meaning only "directly on" and "directly over". Rather, if one element is positioned "on" or "over" another element (e.g., a layer is "on" or "over" another layer or "on" or "over" a substrate), a further component (e.g., a further layer) may be positioned between the two elements (e.g., a further layer may be positioned between a layer and a substrate if the layer is "on" or "over" said substrate).

An example of the present disclosure relates to a semiconductor device. The semiconductor device includes a semiconductor body having a first surface and a second surface opposite to each other along a vertical direction. The semiconductor device further includes an active diode area. The active diode area may include a p-doped anode region adjoining the first surface of the semiconductor body. The active diode area may further include an n-doped drift region arranged between the anode region and the second surface. The active diode area may further include an n-doped cathode contact region adjoining the second surface. The active diode area may further include a p-doped injection region adjoining the second surface and the cathode contact region. The active diode area may further include a p-doped auxiliary region arranged between the drift region and the cathode contact region. The auxiliary region may include a first sub-region and a second sub-region. In a top view, the first sub-region may cover at least part of the injection region, and the second sub-region may cover at least part of the cathode contact region. In the top view, the auxiliary region may include a plurality of openings. The plurality of openings may cover from 0.1% to 20% of a surface area of the active diode area at the second surface.

The semiconductor device may be a semiconductor diode or a reverse conducting insulated gate bipolar transistor, RC-IGBT. The semiconductor device may be a vertical power semiconductor device, e.g. a vertical power diode or a vertical power RC-IGBT, having a load current flow between a first load terminal at the first surface and a second load terminal at the second surface opposite to the first surface. The power semiconductor device may be configured to conduct currents of more than 1 A or more than 10 A or even more than 30 A and may be further configured to block voltages between load terminals, e.g. between cathode and anode (for a power diode) or between collector and emitter (for a power RC-IGBT), in the range of several hundreds of up to several thousands of volts, e.g. 400 V, 650V, 1.2 kV, 1.7 kV, 3.3 kV, 4.5 kV, 5.5 kV, 6 kV, 6.5 kV. The blocking voltage may correspond to a voltage class specified in a datasheet of the power semiconductor device, for example.

The semiconductor body may include or consist of a semiconductor material from the group IV elemental semiconductors, IV-IV compound semiconductor material, III-V compound semiconductor material, or II-VI compound semiconductor material. Examples of semiconductor materials from the group IV elemental semiconductors include, inter alia, silicon (Si) and germanium (Ge). Examples of IV-IV compound semiconductor materials include, inter alia, silicon carbide (SiC) and silicon germanium (SiGe). Examples of III-V compound semiconductor material include, inter alia, gallium arsenide (GaAs), gallium nitride (GaN), gallium phosphide (GaP), indium phosphide (InP), indium gallium nitride (InGaN) and indium gallium arsenide (InGaAs). Examples of II-VI compound semiconductor materials include, inter alia, cadmium telluride (CdTe), mercury-cadmium-telluride (CdHgTe), and cadmium magnesium telluride (CdMgTe). For example, the semiconductor body may be a magnetic Czochralski, MCZ, or a float zone (FZ) or an epitaxially deposited silicon semiconductor body.

The first surface may be a level at an interface between the semiconductor body and a wiring area above the semiconductor body at a first side, e.g. front side of the semiconductor body. The second surface may be a level at an interface between the semiconductor body and a contact above the semiconductor body at a second side, e.g. rear or back side of the semiconductor body. The semiconductor body may be attached to a lead frame via the second surface, for example. Over the first surface of the semiconductor body, bond pads may be arranged and bond wires may be bonded on the bond pads, for example.

The active diode area may be defined by an area of the semiconductor body where an anode region at the first surface and a cathode region are arranged opposite to one another along the vertical direction. In the active diode area, a load current may enter or exit the semiconductor body of the semiconductor device, e.g. via contact plugs on the first surface of the semiconductor body. For example, the active area may be defined by an area where contact plugs are placed over the first surface for electrically connecting an electrode over the first surface to any semiconductor layers in the active diode area, e.g. to the anode region. For realizing a desired current carrying capacity, the active diode area may be designed by a plurality of parallel-connected diode cells. The parallel-connected diode cells may, for example, be diode cells formed in the shape of a strip or a strip segment. The diode cells can also have any other shape, e.g. circular, elliptical, polygonal such as hexagonal or octahedral.

The p-doped anode region may be electrically connected to an anode terminal or anode electrode over the first surface of the semiconductor body. The anode region may be formed by one or a plurality of anode sub-regions. The anode sub-regions may differ from one another with respect to at least one of dopant species, doping concentration profile, vertical extension. The anode sub-regions may overlap one another and may form a continuous anode region, for example. For example, the anode region may be formed by an ion implantation process with subsequent drive-in steps. Anode sub-regions may be formed by a plurality of ion implantation processes with subsequent drive-in steps having different ion implantation energies and/or ion implantation doses. For example, the anode region may adjoin a contact plug or contact line at the first main surface.

For example, the anode terminal may be a contact area and be formed by all or part of a wiring layer. For example, the wiring layer may correspond to one wiring level of a wiring area above the first surface, wherein the one wiring level of the wiring area may be located closest to the first surface in case of multiple wiring levels. The wiring area may include one or more than one, e.g. two, three, four or even more wiring levels. Each wiring level may be formed by a single one or a stack of conductive layers, e.g. a doped semiconductor material (e.g., a degenerate doped semiconductor material) such as doped polycrystalline silicon, metal or metal compound, for example. Exemplary conductive materials include one or more of titanium nitride (TiN) and tungsten (W), aluminum (Al), copper (Cu), alloys of aluminum or copper, for example AlSi, AlCu or AlSiCu, nickel (Ni), titanium (Ti), tungsten (W), tantalum (Ta), silver (Ag), gold (Au), platinum (Pt), palladium (Pd). The wiring levels may be lithographically patterned, for example. Between stacked wiring levels, an intermediate dielectric may be arranged. Contact plug(s) or contact line(s) may be formed in openings in the intermediate dielectric to electrically connect parts, e.g. metal lines or contact areas, of different wiring levels to one another. For example, the contact area of the anode terminal may be electrically connected to the anode region in the semiconductor body by contact plugs arranged between the anode region and the contact area of the anode terminal.

For example, an impurity concentration in the drift region may gradually or in steps increase or decrease with increasing distance to the first surface at least in portions of its vertical extension. According to other examples the impurity concentration in the drift region may be approximately uniform. For power semiconductor diodes or RC-IGBTs based on silicon, a mean impurity concentration in the drift region may be between $2\times10^{12}$ cm$^{-3}$ and $1\times10^{15}$ cm$^{-3}$, for example in a range from $5\times10^{12}$ cm$^{-3}$ to $2\times10^{14}$ cm$^{-3}$. In the case of a power semiconductor diode or RC-IGBT based on SiC, a mean impurity concentration in the drift region may be between $5\times10^{14}$ cm$^{-3}$ and $1\times10^{17}$ cm$^{-3}$, for example in a range from $1\times10^{15}$ cm$^{-3}$ to $2\times10^{16}$ cm$^{-3}$. A vertical extension of the drift region may depend on voltage blocking requirements, e.g. a specified voltage class, of the vertical power semiconductor device. When operating the vertical power semiconductor diode or vertical power semiconductor RC-IGBT in voltage blocking mode, a space charge region may vertically extend partly or totally through the drift region depending on the blocking voltage applied to the semiconductor device. The semiconductor device may also include an n-doped field stop region arranged between the drift region and the second surface. When operating the vertical power semiconductor diode or the vertical power semiconductor RC-IGBT at or close to the specified maximum blocking voltage, the space charge region may reach or penetrate into the field stop region. The field stop region is configured to prevent the space charge region from further reaching to a cathode contact at the second surface of the semiconductor body. In this manner, the drift region may be formed using desired low doping levels and with a desired thickness while achieving soft switching for the semiconductor diode thus formed.

Since the field stop region aims at preventing the space charge region from reaching the cathode contact at the second surface of the semiconductor body in a voltage blocking mode at or around maximum specified voltage blocking capabilities of the semiconductor diode, a mean net impurity concentration in the field stop region may be higher than in the drift region by at least one order of magnitude, for example. Moreover, the mean net impurity concentration in the field stop region may be lower than the impurity concentration in the cathode contact region by at least one order of magnitude, for example.

The n-doped cathode contact region may provide an ohmic contact to a cathode terminal or a cathode contact at the second surface and may also contribute to the diode functionality by injecting electrons into the drift region in a forward-bias operation mode of the semiconductor device. The p-doped injection region between the field stop region and the second surface has a conductivity type different from the cathode contact region. The p-doped injection region may have an average doping concentration ranging from $10^{17}$ cm$^{-3}$ to $10^{20}$ cm$^{-3}$, or from $10^{16}$ cm$^{-3}$ to $10^{19}$ cm$^{-3}$. The injection region may be configured to improve softness of the diode switching behavior by injecting holes into the drift zone during the turn-off process.

The first sub-region and the second sub-region may laterally adjoin one another, e.g. the first sub-region may laterally turn into the second sub-region, e.g. at a lateral position where the cathode contact region adjoins the injection region. The first and second sub-regions may contribute to an improvement of the softness of the diode, for example. By providing the plurality of openings in the auxiliary region, undesired snap-back behavior in the forward biased current voltage characteristic may be avoided.

The semiconductor device may further include an edge termination area that may include a termination structure. The edge termination area may at least partly surround the active area of the semiconductor device, wherein the active area may be the active diode area in case of a power semiconductor diode or may include the active diode area in addition to a transistor cell area in case of an RC-IGBT. In a blocking mode or in a reverse biased mode of the vertical semiconductor device, the blocking voltage between the active diode area and a field-free region laterally drops across the termination structure in the edge termination area. The termination structure may have a higher or a slightly lower voltage blocking capability than the transistor cell area. The termination structure may include a junction termination extension (JTE) with or without a variation of lateral doping (VLD), one or more laterally separated guard rings, or any combination thereof, for example.

By combining the n-doped cathode contact region, the p-doped injection region and the p-doped auxiliary region including the plurality of openings therein, switching characteristics of the semiconductor device may be improved by increasing the switching softness.

For example, at least two of the plurality of openings may differ with respect to a minimum lateral extent. The lateral extent may vary with respect to the active diode area. In addition or as an alternative, the n-doped cathode contact region, the p-doped injection region and the p-doped auxiliary region including the plurality of openings therein may extend into the edge termination area. In this case, the minimum lateral extent may also vary between the active diode area and the edge termination area with respect to one or more of the n-doped cathode contact region, the p-doped injection region and the p-doped auxiliary region.

Another example of the present disclosure relates to a semiconductor device. The semiconductor device includes a semiconductor body having a first surface and a second surface opposite to each other along a vertical direction. The semiconductor device further includes an active diode area. The active diode area may include a p-doped anode region adjoining the first surface of the semiconductor body. The active diode area may further include an n-doped drift region arranged between the anode region and the second surface. The active diode area may further include an n-doped cathode contact region adjoining the second surface. The active diode area may further include a p-doped injection region adjoining the second surface and the cathode contact region. The active diode area may further include a p-doped auxiliary region arranged between the drift region and the cathode contact region. The auxiliary region may include a first sub-region and a second sub-region. In a top view, the first sub-region may cover at least part of the injection region, and the second sub-region may cover at least part of the cathode contact region. In the top view, the auxiliary region may include a plurality of openings. In the top view, a minimum lateral extent of the plurality of openings may range from 2% to 20% of a minimum lateral extent of the first sub-region.

Another example of the present disclosure relates to a to a semiconductor device. The semiconductor device includes a semiconductor body having a first surface and a second surface opposite to each other along a vertical direction. The semiconductor device further includes an active diode area. The active diode area may include a p-doped anode region adjoining the first surface of the semiconductor body. The active diode area may further include an n-doped drift region arranged between the anode region and the second surface. The active diode area may further include an n-doped cathode contact region adjoining the second surface. The active diode area may further include a p-doped injection region adjoining the second surface and the cathode contact region. The active diode area may further include a p-doped auxiliary region arranged between the drift region and the cathode contact region. The auxiliary region may include a first sub-region and a second sub-region. In a top view, the first sub-region may cover at least part of the injection region, and the second sub-region may cover at least part of the cathode contact region. In the top view, the auxiliary region may include a plurality of openings. In the top view, a minimum lateral extent of the plurality of openings may range from 20% to 80% of a minimum lateral extent of the second sub-region.

Another example of the present disclosure relates to another semiconductor device. The semiconductor device includes a semiconductor body having a first surface and a second surface opposite to each other along a vertical direction. The semiconductor device further includes an active diode area. The active diode area may include a p-doped anode region adjoining the first surface of the semiconductor body. The active diode area may further include an n-doped drift region arranged between the anode region and the second surface. The active diode area may further include an n-doped cathode contact region adjoining the second surface. The active diode area may further include a p-doped injection region adjoining the second surface and the cathode contact region. The active diode area may further include a p-doped auxiliary region arranged between the drift region and the cathode contact region. The auxiliary region may include a first sub-region and a second sub-region. In a top view, the first sub-region may cover at least part of the injection region, and the second sub-region may cover at least part of the cathode contact region. In the top view, the auxiliary region may include a plurality of openings. At least two of the plurality of openings may differ with respect to a minimum lateral extent.

For example, in a top view, the first sub-region, the second subregion, and the plurality of openings may cover 100% of the surface area of the active diode area at the second surface. In other words, apart from the openings in the auxiliary region, the surface area of the active diode area is fully covered by the auxiliary region.

For example, the cathode contact region may adjoin the second sub-region. A vertical extent of the cathode contact region may range from 0.1 μm to 1 μm, or from 0.3 μm to 1 μm. A vertical extent of the second sub-region may range from 0.05 μm to 1 μm, or from 0.1 μm to 1 μm. A vertical extent of the injection region may range from 0.05 μm to 1 μm, or from 0.1 μm to 1 μm.

For example, the first sub-region may include a vertical concentration profile of p-type dopants, and at least one of the plurality of openings comprises the vertical concentration profile of p-type dopants that partially compensates a vertical concentration profile of n-type dopants. For example, the vertical concentration profile of p-type dopants of the first sub-region may be equal to the vertical concentration profile of p-type dopants of the second sub-region. For example, the first and second sub-region may be concurrently formed, e.g. by one or more masked ion implantation processes. The ion implantation processes may be unmasked with respect to the active diode area. In the plurality of openings, the number n-type dopants may outnumber the number of p-type dopants, i.e. the p-type dopants lead to a partial compensation of the n-type doping.

For example, the semiconductor device may further include a groove contact at the second surface. The groove contact may adjoin the at least one of the plurality of openings. For example, the groove contact may be formed by etching a groove or trench into the semiconductor body from the second surface. The groove or trench may end at a bottom side of the second sub-region of the auxiliary region.

Before filling the groove contact with a contact material, n-type dopants may be introduced into the semiconductor body, e.g. by an ion implantation process, for counter-doping the second sub-region. Thereby, openings in the second sub-region may be formed, for example.

For example, at least one of the plurality of openings may include a part of a contact spike extending from the second surface and through the second sub-region. The contact spike may extent into the drift region or field stop region, for example. The contact spike may be formed by applying a laser process to a contact material, e.g. metal layer, at the second surface of the semiconductor body, for example.

For example, the auxiliary region may be arranged at a vertical distance from each of the cathode contact region or the injection region. For example, a part of the semiconductor body arranged between the auxiliary region and the injection region may be n-doped. The vertical distance may range from 0.1 μm to 1 μm, or from 0.3 μm to 1 μm, for example.

For example, the second sub-region may be arranged at a vertical distance from the cathode contact region. The first sub-region may adjoin the injection region. The vertical distance may range from 0.1 μm to 1 μm, or from 0.3 μm to 1 μm, for example. For example, a part of the semiconductor body arranged between the auxiliary region and the injection region may be n-doped. A vertical projection of the first sub-region may be fully included in the injection region, for example. Likewise, a vertical projection of the second sub-region may be fully included in the cathode contact region, for example.

For example, the first sub-region may be arranged at a vertical distance from the injection region. The second sub-region may adjoin the cathode contact region. For example, a part of the semiconductor body arranged between the first sub-region and the injection region may be n-doped. The vertical distance may range from 0.1 μm to 1 μm, or from 0.3 μm to 1 μm, for example.

For example, the semiconductor device may further include a plurality of the first sub-regions. In the top view, at least one of the plurality of the first sub-regions may be surrounded laterally by the second sub-region. At least one of the plurality of openings may be surrounded laterally by the second sub-region.

For example, in the top view, at least one of the plurality of the first sub-regions may be circular, elliptical, stripe-shaped, or polygonal, and at least one of the plurality of openings may be circular, elliptical, stripe-shaped, or polygonal. Likewise, in the top view, the injection region may be circular, elliptical, stripe-shaped, or polygonal, for example.

For example, in the top view, the at least one of the plurality of the first sub-regions may have a larger minimum lateral extent than the at least one of the plurality of openings. Likewise, in the top view, the injection region may have a larger minimum lateral extent than the at least one of the plurality of openings.

For example, at least two of the plurality of the first sub-regions may differ with respect to a minimum lateral extent. Likewise, the semiconductor device may include a plurality of the injection regions, and at least two of the plurality of the injection regions may differ with respect to a minimum lateral extent.

For example, the semiconductor device may further include an edge termination area. The active diode area may be surrounded laterally by the edge termination area. The cathode contact region may adjoin the second surface in the edge termination area.

For example, the first sub-region may be arranged in the edge termination area.

Details with respect to structure, or function, or technical benefit of features described above with respect to a semiconductor device likewise apply to the exemplary methods described herein. Processing the semiconductor body may comprise one or more optional additional features corresponding to one or more aspects mentioned in connection with the proposed concept or one or more examples described above or below.

An example of the present disclosure relates to method for manufacturing a semiconductor device. The method includes providing a semiconductor body having a first surface and a second surface opposite to each other along a vertical direction. The method further includes forming an active diode area. Forming the active diode area may include forming a p-doped anode region adjoining the first surface of the semiconductor body. The method may further include forming an n-doped drift region arranged between the anode region and the second surface. The method may further include forming an n-doped cathode contact region adjoining the second surface. The method may further include forming a p-doped injection region adjoining the second surface, and the cathode contact region. The method may further include forming a p-doped auxiliary region arranged between the drift region and the cathode contact region. The auxiliary region may include a first sub-region and a second sub-region. In a top view, the first sub-region may cover at least part of the injection region, and the second sub-region may cover at least part of the cathode contact region. In the top view, the auxiliary region may include a plurality of openings. The plurality of openings may cover from 0.1% to 20% of a surface area of the active diode area at the second surface.

Another example of the present disclosure relates to another method for manufacturing a semiconductor device. The method includes providing a semiconductor body having a first surface and a second surface opposite to each other along a vertical direction. The method further includes forming an active diode area. Forming the active diode area may include forming a p-doped anode region adjoining the first surface of the semiconductor body. The method may further include forming an n-doped drift region arranged between the anode region and the second surface. The method may further include forming an n-doped cathode contact region adjoining the second surface. The method may further include forming a p-doped injection region adjoining the second surface, and the cathode contact region. The method may further include forming a p-doped auxiliary region arranged between the drift region and the cathode contact region. The auxiliary region may include a first sub-region and a second sub-region. In a top view, the first sub-region may cover at least part of the injection region, and the second sub-region may cover at least part of the cathode contact region. In the top view, the auxiliary region may include a plurality of openings. At least two of the plurality of openings may differ with respect to a minimum lateral extent.

More details and aspects are mentioned in connection with the examples described above or below. Processing a semiconductor body, e.g. a semiconductor wafer, may comprise one or more optional additional features corresponding to one or more aspects mentioned in connection with the proposed concept or one or more examples described above or below.

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

It is to be understood that the disclosure of multiple acts, processes, operations, steps or functions disclosed in the specification or claims may not be construed as to be within the specific order, unless explicitly or implicitly stated otherwise, e.g. by expressions like "thereafter", for instance for technical reasons. Therefore, the disclosure of multiple acts or functions will not limit these to a particular order unless such acts or functions are not interchangeable for technical reasons. Furthermore, in some examples a single act, function, process, operation or step may include or may be broken into multiple sub-acts, -functions, -processes, -operations or -steps, respectively. Such sub acts may be included and part of the disclosure of this single act unless explicitly excluded.

FIG. 1 schematically and exemplarily shows a cross-sectional view of a part of a semiconductor device 100. The illustrated part of the semiconductor device 100 is an active diode area 108.

In a semiconductor body 102 of the semiconductor device 100, a first surface 104 and a second surface 106 are arranged opposite to each other along a vertical direction y. In the active diode area 108, a p-doped anode region 110 adjoins the first surface 104 of the semiconductor body 102. An n-doped drift region 112 is arranged between the anode region 110 and the second surface 106. The n-doped drift region 110 may have the lowest doping concentration with respect to the doped regions in the semiconductor body 102, for example. An n-doped cathode contact region 114 adjoins the second surface 106. A p-doped injection region 116 adjoins the second surface 106 and the cathode contact region 114. A p-doped auxiliary region 118 is arranged between the drift region 112 and the cathode contact region 114, as well as between the drift region 112 and the injection region 116. The auxiliary region 118 includes a first sub-region 1181 and a second sub-region 1182. The first and second sub-regions 1181, 1182 may turn into one another at a lateral position where the injection region 116 adjoins the cathode contact region 114, for example. Thus, in a top view, the first sub-region 1181 covers at least part of the injection region 116, and the second sub-region 1182 covers at least part of the cathode contact region 114. In the illustrated design example, the injection region 116 vertically adjoins the first sub-region 1181, and the cathode contact region 114 vertically adjoins the second sub-region 1182.

Also referring to the schematic top views illustrated in FIGS. 2A to 2J, exemplary designs are illustrated. The auxiliary region 118 includes a plurality of openings 120. In some of the illustrated design examples, unit cells 122 demonstrate the smallest repeated unit of arrangement of the openings 120. The plurality of openings 120 cover from 0.1% to 20%, or from 0.5% to 15%, or from 1% to 10% of a surface area of the active diode area 108 at the second surface 106 (see, for example and inter alia, FIG. 2A). Additionally or as an alternative, in the top view, at least two of the plurality of openings 120 differ with respect to a minimum lateral extent l1 (see, for example and inter alia, FIGS. 2H, 2J). Additionally or as an alternative, in the top view, a minimum lateral extent l1 of the plurality of openings 120 ranges from 20% to 80% of a minimum lateral extent l3 of the second sub-region 1182 (see, for example and inter alia, FIG. 2A). Additionally or as an alternative, in the top view, a minimum lateral extent l1 of the plurality of openings 120 may range from 2% to 20% of a minimum lateral extent l2 of the first sub-region (see, for example and inter alia, FIG. 2A).

In the illustrated top views of FIGS. 2A to 2J, the plurality of the first sub-regions 1181 and the plurality of the openings 120 have a circular shape. However, other shapes may be applied and combined with respect to the plurality of the first sub-regions 1181 and/or the plurality of the openings 120. In the schematic top views of FIGS. 3A to 3C, the exemplary stripe-shaped designs of the first and second sub-regions 1181, 1182 and the openings 120 are illustrated. In the design examples of FIGS. 3A and 3C, stripe-shaped first and second sub-regions 1181, 1182 and stripe-shaped openings 120 extend in parallel. In addition, in FIG. 3C, a width of the openings 120 varies along a longitudinal direction of the stripes. In the design example of FIG. 3B, the stripe-shaped first sub-regions 1181 extend perpendicular to the stripe-shaped second sub-regions 1182 and stripe-shaped openings 120.

Figures 3A, 3B, 3C, 4A, 4B, 4C, 5A, 5B:
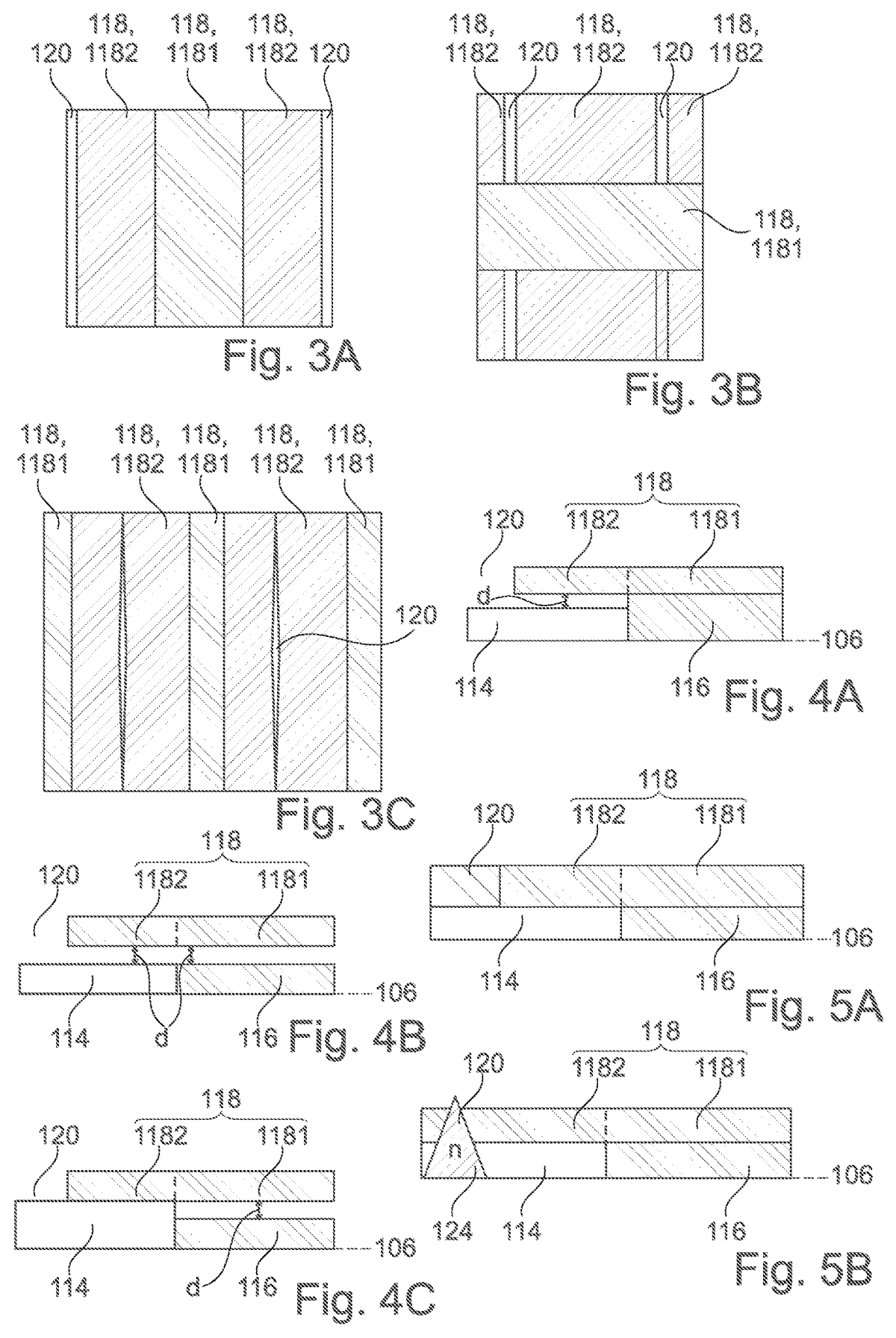

In the design example of FIG. 4A, the second sub-region 1182 is arranged at a vertical distance d from the cathode contact region 114. The injection region 116 vertically adjoins, or turns into, the first sub-region 118.

In the design example of FIG. 4B, the auxiliary region 118 is arranged at a vertical distance d from each of the cathode contact region 114 or the injection region 116.

In the design example of FIG. 4C, the first sub-region 1181 is arranged at a vertical distance d from the injection region 116. The second sub-region 1182 adjoins the cathode contact region 114.

In the design example of FIG. 5A, the first sub-region 1181 includes a vertical concentration profile of p-type dopants, and at least one of the plurality of openings 120 includes the vertical concentration profile of p-type dopants that partially compensates a vertical concentration profile of the n-type dopants. The design example of FIG. 5A may be formed by applying a locally melting laser process to the second surface of the semiconductor body, for example.

In the design example of FIG. 5B, at least one of the plurality of openings 120 includes or if filled with a part of a contact spike 124 extending from the second surface and through the second sub-region 1182.

As is illustrated in the schematic top views of FIGS. 6A to 6D, the semiconductor device further includes an edge termination area 126. The active diode area 108 is surrounded laterally by the edge termination area 126.

Figures 6A, 6B:
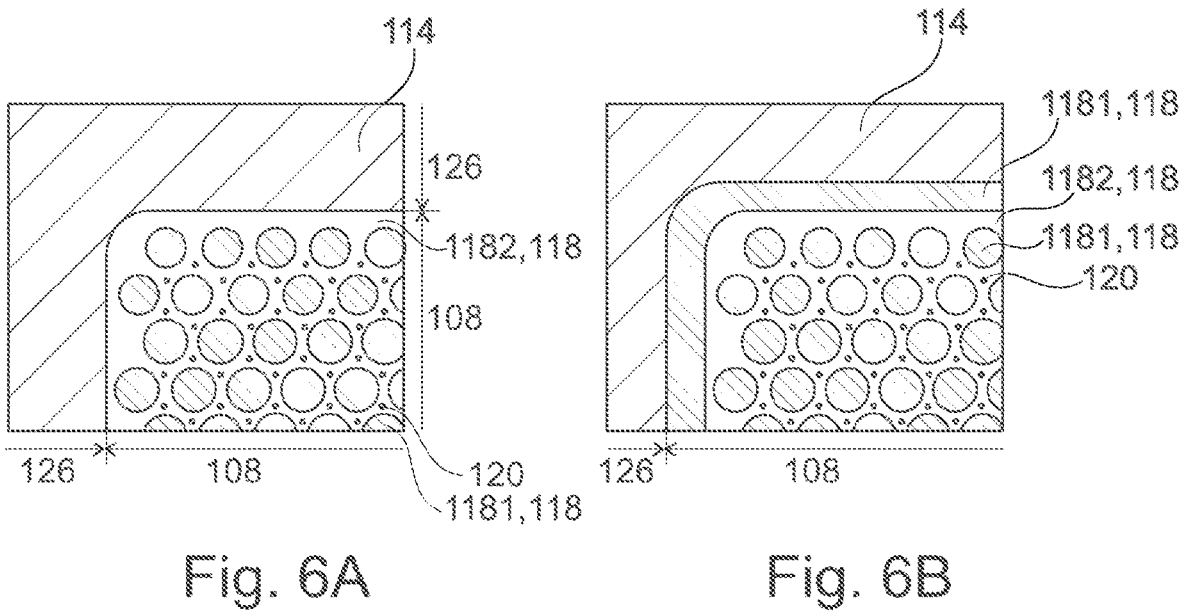
FIGS. 6A to 6D are top views for illustrating design examples for an edge termination area surrounding the active diode region.

Referring to the design example of FIG. 6A, the cathode contact region 114 adjoins the second surface in the edge termination area 126. The first sub-region 1181 may be omitted in the edge termination area 126.

Referring to the design example of FIG. 6B, the first sub-region 1181 extends into the edge termination area 126 and is arranged between the cathode contact region 114 in the edge termination area 126 and the active diode area 108.

Figures 6C, 6D:
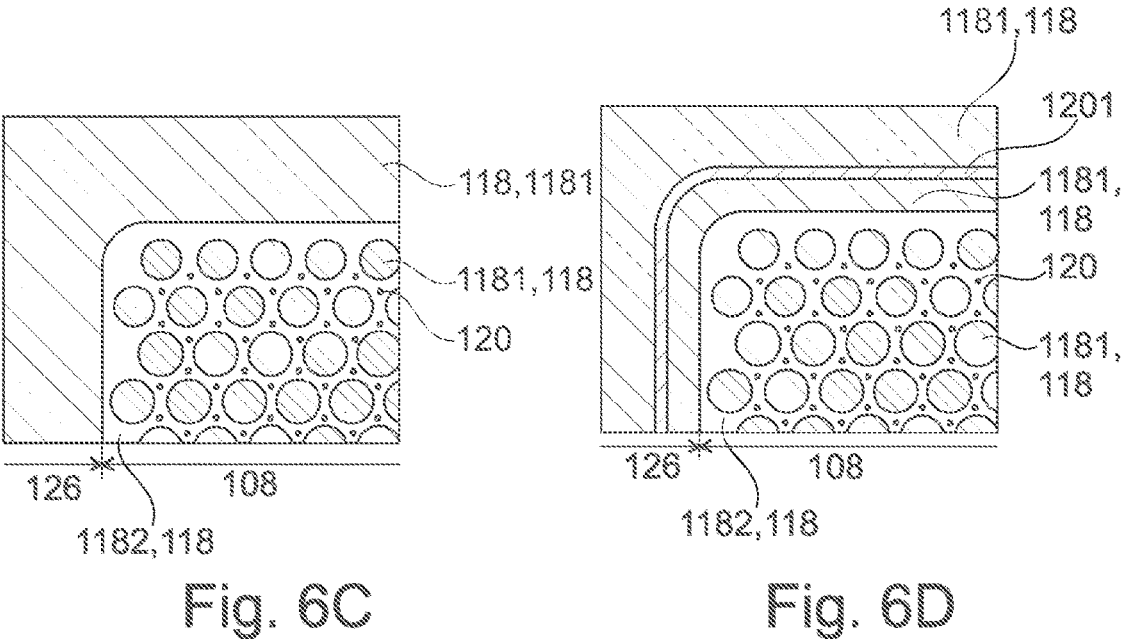

Referring to the design example of FIG. 6C, the first sub-region 1181 is arranged in the edge termination area 126. The cathode contact region 104 may be omitted in the edge termination area 126, for example.

Referring to the design example of FIG. 6D, the first sub-region 1181 is arranged in the edge termination area 126 and includes a first part and a second part. The first part and the second part are laterally separated by an opening 1201 to the cathode contact region 114.

Figure 7:
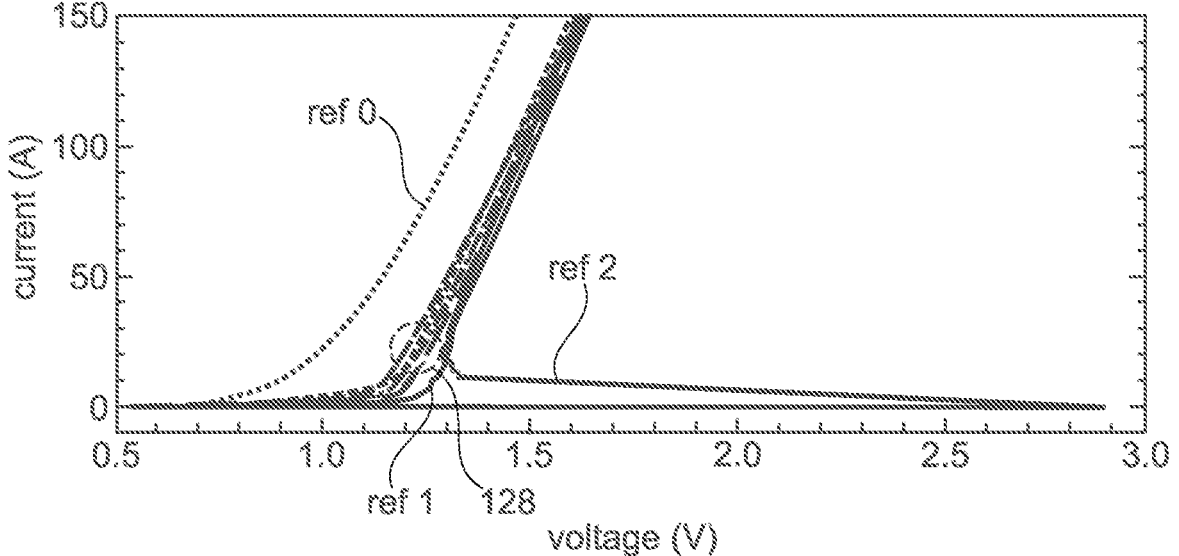
FIG. 7 is a graph for illustrating forward current vs. voltage characteristics (I/V characteristics) of power semiconductor diodes.

The schematic graph of FIG. 7 is based on experimental data and illustrates forward current vs. voltage characteristics (I/V characteristics) of power semiconductor diodes. Provision of openings in the auxiliary region as described in the examples above (see, for example, FIG. 1) is associated with I/V curves marked by dashed circle 128. The power semiconductor diodes associated with the IV curves marked by dashed circle 128 differ from one another with respect to a width of the openings. The diodes marked by dashed circle 128 have IV characteristics that are laterally shifted by several 100 mV, i.e. have a larger forward blocking capability, compared with an IV characteristic of a reference diode ref0 that does not have an auxiliary region. The IV characteristics of the power diodes marked by dashed circle 128 also allow for avoiding undesired snap-back characteristics in the IV curves that are present in power semiconductor diodes marked ref1, ref2. In the power semiconductor diodes marked ref1, ref2, the auxiliary region is present in the active area without any openings and is omitted in the edge termination area (I/V curved marked ref1), or is present in the active area and in the edge termination area without any openings (I/V curved marked ref1).

The description and drawings merely illustrate the principles of the disclosure. Furthermore, all examples recited herein are principally intended expressly to be only for illustrative purposes to aid the reader in understanding the principles of the disclosure and the concepts contributed by the inventor(s) to furthering the art. All statements herein reciting principles, aspects, and examples of the disclosure, as well as specific examples thereof, are intended to encompass equivalents thereof.

The aspects and features mentioned and described together with one or more of the previously detailed examples and figures, may as well be combined with one or more of the other examples in order to replace a like feature of the other example or in order to additionally introduce the feature to the other example.

What is claimed is:

1. A semiconductor device, comprising:
a semiconductor body having a first surface and a second surface opposite to each other along a vertical direction; and
an active diode area comprising:
a p-doped anode region adjoining the first surface of the semiconductor body;
an n-doped drift region arranged between the p-doped anode region and the second surface;
an n-doped cathode contact region adjoining the second surface;
a p-doped injection region adjoining the second surface and the n-doped cathode contact region;
a p-doped auxiliary region arranged between the n-doped drift region and the n-doped cathode contact region,
wherein the p-doped auxiliary region includes a first sub-region and a second sub-region,
wherein in a top view, the first sub-region covers at least part of the p-doped injection region and the second sub-region covers at least part of the n-doped cathode contact region,
wherein in the top view, the p-doped auxiliary region includes a plurality of openings covering from 0.1% to 20% of a surface area of the active diode area at the second surface.

2. The semiconductor device of claim 1, wherein at least two of the plurality of openings differ with respect to a minimum lateral extent.

3. The semiconductor device of claim 1, wherein in the top view, the first sub-region, the second sub-region, and the plurality of openings cover 100% of the surface area of the active diode area at the second surface.

4. The semiconductor device of claim 1, wherein the n-doped cathode contact region adjoins the second sub-region, a vertical extent of the n-doped cathode contact region ranges from 0.1 μm to 1 μm of the p-doped injection region, and a vertical extent of the second sub-region ranges from 0.05 μm to 1 μm.

5. The semiconductor device of claim 1, wherein the first sub-region comprises a vertical concentration profile of p-type dopants, and at least one opening of the plurality of openings comprises the vertical concentration profile of p-type dopants that partially compensates a vertical concentration profile of n-type dopants.

6. The semiconductor device of claim 1, further comprising a groove contact at the second surface, the groove contact adjoining the at least one of the plurality of openings.

7. The semiconductor device of claim 1, wherein at least one opening of the plurality of openings comprises a part of a contact spike extending from the second surface and through the second sub-region.

8. The semiconductor device of claim 1, wherein the p-doped auxiliary region is arranged at a vertical distance from each of the n-doped cathode contact region and the p-doped injection region.

9. The semiconductor device of claim 1, wherein the second sub-region is arranged at a vertical distance from the n-doped cathode contact region, and the first sub-region adjoins the p-doped injection region.

10. The semiconductor device of claim 1, wherein the first sub-region is arranged at a vertical distance from the p-doped injection region, and the second sub-region adjoins the n-doped cathode contact region.

11. The semiconductor device of claim 1, wherein the p-doped auxiliary region includes a plurality of the first sub-regions, wherein in the top view, at least one first sub-region of the plurality of the first sub-regions is surrounded laterally by the second sub-region, and wherein at least one opening of the plurality of openings is surrounded laterally by the second sub-region.

12. The semiconductor device of claim 11, wherein in the top view, the at least one first sub-region of the plurality of the first sub-regions is circular, elliptical, stripe-shaped, or polygonal, and the at least one opening of the plurality of openings is circular, elliptical, stripe-shaped, or polygonal.

13. The semiconductor device of claim 12, wherein in the top view, the at least one first sub-region of the plurality of the first sub-regions has a larger minimum lateral extent than the at least one opening of the plurality of openings.

14. The semiconductor device of claim 11, wherein at least two first sub-regions of the plurality of the first sub-regions differ with respect to a minimum lateral extent.

15. The semiconductor device of claim 1, further comprising an edge termination area, wherein the active diode area is surrounded laterally by the edge termination area, and wherein the n-doped cathode contact region adjoins the second surface in the edge termination area.

16. The semiconductor device of claim 15, wherein the first sub-region is arranged in the edge termination area.

17. A semiconductor device, comprising:
a semiconductor body having a first surface and a second surface opposite to each other along a vertical direction; and
an active diode area comprising:
a p-doped anode region adjoining the first surface of the semiconductor body;

an n-doped drift region arranged between the p-doped anode region and the second surface;

an n-doped cathode contact region adjoining the second surface;

a p-doped injection region adjoining the second surface and the n-doped cathode contact region;

a p-doped auxiliary region arranged between the n-doped drift region and the n-doped cathode contact region, wherein the p-doped auxiliary region includes a first sub-region and a second sub-region, wherein in a top view, the first sub-region covers at least part of the p-doped injection region and the second sub-region covers at least part of the n-doped cathode contact region, wherein in the top view, the p-doped auxiliary region includes a plurality of openings, wherein at least two openings of the plurality of openings differ with respect to a minimum lateral extent.

18. The semiconductor device of claim 17, wherein in the top view, the first sub-region, the second sub-region, and the plurality of openings cover 100% of a surface area of the active diode area at the second surface.

19. The semiconductor device of claim 17, wherein the n-doped cathode contact region adjoins the second sub-region, a vertical extent of the n-doped cathode contact region ranges from 0.1 µm to 1 µm of the p-doped injection region, and a vertical extent of the second sub-region ranges from 0.05 µm to 1 µm.

20. The semiconductor device of claim 17, wherein the first sub-region comprises a vertical concentration profile of p-type dopants, and at least one opening of the plurality of openings comprises the vertical concentration profile of p-type dopants that partially compensates a vertical concentration profile of n-type dopants.

21. The semiconductor device of claim 17, further comprising a groove contact at the second surface, the groove contact adjoining the at least one of the plurality of openings.

22. The semiconductor device of claim 17, wherein at least one opening of the plurality of openings comprises a part of a contact spike extending from the second surface and through the second sub-region.

23. The semiconductor device of claim 17, wherein the p-doped auxiliary region is arranged at a vertical distance from each of the n-doped cathode contact region and the p-doped injection region.

24. The semiconductor device of claim 17, wherein the second sub-region is arranged at a vertical distance from the n-doped cathode contact region, and the first sub-region adjoins the p-doped injection region.

25. The semiconductor device of claim 17, wherein the first sub-region is arranged at a vertical distance from the p-doped injection region, and the second sub-region adjoins the n-doped cathode contact region.

26. The semiconductor device of claim 17, wherein the p-doped auxiliary region includes a plurality of the first sub-regions, wherein in the top view, at least one first sub-region of the plurality of the first sub-regions is surrounded laterally by the second sub-region, and wherein at least one opening of the plurality of openings is surrounded laterally by the second sub-region.

27. The semiconductor device of claim 26, wherein in the top view, the at least one first sub-region of the plurality of the first sub-regions is circular, elliptical, stripe-shaped, or polygonal, and the at least one opening of the plurality of openings is circular, elliptical, stripe-shaped, or polygonal.

28. The semiconductor device of claim 27, wherein in the top view, the at least one first sub-region of the plurality of the first sub-regions has a larger minimum lateral extent than the at least one opening of the plurality of openings.

29. The semiconductor device of claim 26, wherein at least two first sub-regions of the plurality of the first sub-regions differ with respect to a minimum lateral extent.

30. The semiconductor device of claim 17, further comprising an edge termination area, wherein the active diode area is surrounded laterally by the edge termination area, and wherein the n-doped cathode contact region adjoins the second surface in the edge termination area.

31. The semiconductor device of claim 30, wherein the first sub-region is arranged in the edge termination area.

32. A method for manufacturing a semiconductor device, the method comprising:

providing a semiconductor body having a first surface and a second surface opposite to each other along a vertical direction;

forming an active diode area, comprising:

forming a p-doped anode region adjoining the first surface of the semiconductor body;

forming an n-doped drift region arranged between the p-doped anode region and the second surface;

forming an n-doped cathode contact region adjoining the second surface;

forming a p-doped injection region adjoining the second surface and the n-doped cathode contact region; and forming a p-doped auxiliary region arranged between the n-doped drift region and the n-doped cathode contact region, the p-doped auxiliary region including a first sub-region and a second sub-region, wherein in a top view, the first sub-region covers at least part of the p-doped injection region and the second sub-region covers at least part of the n-doped cathode contact region, wherein in the top view, the p-doped auxiliary region includes a plurality of openings covering from 0.1% to 20% of a surface area of the active diode area at the second surface.

33. A method for manufacturing a semiconductor device, the method comprising:

providing a semiconductor body having a first surface and a second surface opposite to each other along a vertical direction;

forming an active diode area, comprising:

forming a p-doped anode region adjoining the first surface of the semiconductor body;

forming an n-doped drift region arranged between the p-doped anode region and the second surface;

forming an n-doped cathode contact region adjoining the second surface;

forming a p-doped injection region adjoining the second surface and the n-doped cathode contact region; and forming a p-doped auxiliary region arranged between the n-doped drift region and the n-doped cathode contact region, the p-doped auxiliary region including a first sub-region and a second sub-region, wherein in a top view, the first sub-region covers at least part of the p-doped injection region and the second sub-region covers at least part of the n-doped cathode contact region, wherein in the top view, the p-doped auxiliary region includes a plurality of openings, wherein at least two openings of the plurality of openings differ with respect to a minimum lateral extent.

*    *    *    *    *